US006078205A

United States Patent [19]

Ohsawa et al.

[11] Patent Number: 6,078,205

[45] Date of Patent: Jun. 20, 2000

[54] CIRCUIT DEVICE, DRIVE CIRCUIT, AND DISPLAY APPARATUS INCLUDING THESE COMPONENTS

[75] Inventors: Michitaka Ohsawa, Fujisawa; Yoshinori Okada, Yokohama; Yuji Sano, Zushi, all of Japan

[73] Assignee: Hitachi, Ltd., Tokyo, Japan

[21] Appl. No.: 09/048,176

[22] Filed: Mar. 26, 1998

[30] Foreign Application Priority Data

Mar. 27, 1997 [JP] Japan .................................... 9-074979

[51] Int. Cl.[7] ....................................................... H03B 1/00

[52] U.S. Cl. ............................................ 327/314; 327/110

[58] Field of Search .................................... 327/108, 110, 327/309, 310, 312, 313, 314, 318, 319, 320, 325, 583

[56] References Cited

U.S. PATENT DOCUMENTS

| | | | |
|---|---|---|---|
| 4,652,796 | 3/1987 | Delgrange et al. | 315/169.4 |
| 4,928,053 | 5/1990 | Sicard et al. | 323/284 |
| 5,349,232 | 9/1994 | Mille et al. | 257/603 |
| 5,384,808 | 1/1995 | Van Brunt et al. | 375/36 |
| 5,508,906 | 4/1996 | Nelli et al. | 363/97 |
| 5,561,384 | 10/1996 | Reents et al. | 327/108 |
| 5,642,065 | 6/1997 | Choi et al. | 327/110 |
| 5,646,561 | 7/1997 | Fanini et al. | 327/110 |
| 5,686,859 | 11/1997 | Majumdar et al. | 327/530 |
| 5,703,457 | 12/1997 | Davis | 318/701 |
| 5,828,244 | 10/1998 | Palara et al. | 327/108 |

FOREIGN PATENT DOCUMENTS

| | | |
|---|---|---|
| 0701239 | 3/1996 | European Pat. Off. . |
| 2552575 | 3/1985 | France . |
| 56-110994 | of 1981 | Japan . |
| 1125018 | of 1989 | Japan . |
| 286313 | of 1990 | Japan . |
| 7-86525 | 3/1995 | Japan . |

*Primary Examiner*—Jeffrey Zweizig
*Attorney, Agent, or Firm*—Antonelli, Terry, Stout & Kraus, LLP

[57] ABSTRACT

In an address electrode drive circuit of a plasma display panel, clamping diodes which yield a small forward voltage drop and have a fast switching speed are connected between the output terminal of the drive circuit and the power source and between the output terminal of the drive circuit and the ground. A backward current and voltage dashing from the load to the output transistors of the drive circuit are initially bypassed and absorbed with the clamping diodes and subsequently bypassed and absorbed with parasitic diodes of the output transistors, and the drive circuit is protected against the incoming surge current and voltage.

22 Claims, 7 Drawing Sheets

CIRCUIT DEVICE, DRIVE CIRCUIT, AND DISPLAY APPARATUS INCLUDING THESE COMPONENTS

BACKGROUND OF THE INVENTION

The present invention relates to a technique of protecting circuit devices and semiconductor elements of drive circuits used in apparatus, such as plasma display apparatus, loaded by discharge cells against the destruction of element caused by abnormal operations.

A conventional technique for a drive circuit used in a plasma display apparatus will be explained first. FIG. 1 shows schematically the drive circuit used in the plasma display panel (will be termed simply "PDP"). The PDP 21 shown here is of the a.c. type, although it may be of the d.c. type.

The PDP 21 has a structure of two glass plates coupled face-to-face by being spaced out appropriately, with address electrodes 23 and scan electrodes 24 for determining light emitting points being arranged in a fashion of orthogonal matrix on the glass plates. A common sustain electrode 25 for sustaining the light emission is arranged in parallel to the scan electrodes 24. Indicated by 28 are discharge areas each defining a unit display pixel.

These electrodes 23,24 and 25 are supplied with drive pulses from an address electrode drive circuit 22, scanning drive circuit 26 and common sustaining circuit 27, respectively.

FIG. 2 is a perspective view of a typical practical PDP of the a.c. type. The PDP has its discharge electrodes including the scan electrodes 24 and common sustain electrode 25 covered with a dielectric substance and protective film for protection against the collision of ion created by discharging.

As shown in FIG. 2, the PDP 21 has a simple 3-electrode structure, in which a front panel 31 with the formation of the scan electrodes 24 and the sustain electrode 25 in the horizontal direction and a rear panel 32 with the formation of the address electrodes 23 in the vertical direction are sticked face-to-face such that the scan electrodes 24 and sustain electrode 25 are orthogonal with the address electrodes 23.

The PDP shown in FIG. 2 has the provision of barrier ribs 33 which separate fluorescent substances 34 of red, green and blue and make a proper distance between the front panel 31 and rear panel 32 so as to form discharge spaces. The scan electrodes 24 and sustain electrode 25 which need to transmit the emitted light are generally transparent electrodes which have a high electrical resistance. For the reduction of resistance of the electrode circuit, there are provided bus electrodes 35 having a small electrical resistance.

The scan electrodes 24 and sustain electrode 25 are covered with a thin film of magnesium oxide (MgO) which serves as a dielectric substance and protective film, although it is not shown in FIG. 2.

The scan electrodes 24, sustain electrode 25 and address electrodes 23 are in static coupling through the cell space and dielectric substance, as will be appreciated from the structure shown in FIG. 2. Therefore, the drive voltages of the electrodes 23,24 and 25 interferewith each other through the static coupling, and cross-talk voltages can possibly be induced. Furthermore, since the electrodes 23,24 and 25 are inside the discharge space, if abnormal discharging occurs in a cell, charges that cannot be controlled by the control voltages of these electrodes will dash into an electrode and a resulting abnormal voltage and current will be applied to the drive circuit of that electrode.

FIG. 3 depicts an example of the waveform of a current which arises due to abnormal discharging in a cell of PDP and flows into the drive circuit. The abnormal discharge current Ia, which is detected on the output terminal of the address electrode drive circuit 22, is plotted in 2 A/div scale on the vertical axis against the time t in 50 ns/div scale on the horizontal axis. FIG. 3 reveals that the current caused by abnormal discharging has an extremely large magnitude as compared with the rated output current of 30–50 mA in general of the address electrode drive circuit 22.

FIG. 4 shows the output stage of the address electrode drive circuit which is used widely in the conventional PDPS. In the case of output elements 52*a* and 52*b* formed of MOSFETs, parasitic diodes 51*a* and 51*b* are formed together with these MOSFETS. Accordingly, the characteristics of the parasitic diodes 51*a* and 51*b* have not been considered independently.

In case the abnormal discharge current Ia as shown in FIG. 3 flows through the output terminal 53 into the drive circuit having its output stage made up of output transistors 52*a* and 52*b* and parasitic diodes 51*a* and 51*b*, it flows through the parasitic diode 51*a* to the power source 56 by being blocked by the output transistor 52*a* which is reverse in connection for the current. In another case when the abnormal discharge current flows to the address electrode 23 through the output terminal 53, it flows from the ground through the parasitic diode 51*b*.

Accordingly, the parasitic diodes 51*a* and 51*b* need to have characteristics enough to withstand the abnormal discharge current Ia. However, the parasitic diodes 51*a* and 51*b* are formed concurrently to the formation of the output MOSFETs 52*a* and 52*b*, instead of being formed independently as mentioned previously, and therefore their design latitude is limited. On this account, it is difficult to fabricate the drive circuit which withstands the abnormal discharge current Ia.

On the other hand, in case a sharp-rising (of the order of several hundreds nanoseconds) abnormal discharge current having a large peak value, e.g.,5 A, flows from the display panel 21 to the output terminal 53, it had been conceived to flow to the power source 56 through the parasitic diode 51*a*. Actually, however, the inventors of the present invention found such a contradictory phenomenon that the apparent forward resistance of the parasitic diode 51*a* increases significantly (a large forward voltage drop emerges between the anode and cathode of the diode).

Specifically, the forward voltage drop of the parasitic diodes 51*a* and 51*b* appearing as a voltage difference between the output terminal 53 and power supply terminal 54, which should be 1 to 2 V inherently, actually produces a voltage difference as large as several volts to several tens volts due to the above-mentioned phenomenon, resulting in a high voltage emergence on the output terminal 53.

Consequently, the output transistor 52*a* connected between the output terminal 53 and ground terminal 55 has on its drain the direct application of the high voltage of the output terminal 53 caused by the abnormal discharge current, and this is a serious matter in regard to the voltage withstanding of the output transistor 52*a*. Particularly, the output transistors 52*a* and 52*b* have their withstand voltage lowered significantly when an abnormally high voltage is applied to the drain in the conductive state, and it is highly possible that these transistors 52*a*, 52*b* will be destroyed.

Breakdown of the output transistors 52*a* and 52*b* is analyzed as follows. If the output transistor 52*b* is in the conductive state when a positive abnormal discharge voltage is applied to the output terminal 53, this transistor 52*b* will first break and become a short circuit. Then, a full power voltage is applied to the output transistor 52*a* through the short-circuit transistor 52*b*, and the transistor 52*a* also breaks.

The withstand voltage and application voltage of the output transistors 52*a* and 52*b* in their conductive state will be explained briefly. The output transistors 52*a* and 52*b* have the highest withstand voltage in the non-conductive (cutoff) state, and the withstand voltage falls as the transistors proceed to the conductive state progressively by being forwardly biased.

In the example of FIG. 4, if the output transistor 52*b* connected between the output terminal 53 and ground terminal 55 (will be termed "pull-down transistor") is in the conductive state by being forwardly biased deeply at the time when the voltage of the output terminal 53 is raised by the incoming abnormal discharge current, the output transistor 52*b* should have a significantly low withstand voltage. In this case, if the entire surge current were to be absorbed by the pull-down transistor 52*b*, the output terminal 53 would not have an abnormal voltage rise irrespective of the function of the parasitic diode 51*a*.

However, the output transistors 52*a* and 52*b* usually have a current rating of 30–50 mA which is incomparably smaller than the abnormal discharge current, and therefore excessive charges that are not absorbed by the pull-down transistor 52*b* will flow to the power source 56 of the drive circuit by way of the parasitic diode 51*a* of the output transistor 52*a* connected between the output terminal 53 and power supply terminal 54 (will be termed "pull-up transistor"). This current raises the voltage of the output terminal 53, i.e., the drain voltage of the pull-down transistor 52*b*, possibly in excess of its withstand voltage.

In case a voltage or current of other attribution than the normal operation is created and applied to the drive circuit, if the voltage or current is in excess of the rating of the output transistors 52*a* and 52*b*, the drive circuit will break. The conventional PDP is not protected satisfactorily from these occasions, and there has been left the room for improvement for the enhancement of reliability.

The conventional drive circuit can possibly be subjected to the application of electrical energy in excess of the ratings of its component parts due to interactions between electrodes, such as cross-talk, or due to the occurrence of abnormal discharging or the like inside the panel. Although semiconductor elements used in the drive circuit have a marginal strength against breakdown in the normal operating region, it is not sufficient against an excessive voltage or current arising in the abnormal operation or a voltage or current that is applied backward relative to the normal operation.

A leak current caused by the cross-talk between electrodes in a cell and a voltage or current applied to an electrode at abnormal discharging are often greater than the voltage and current of the normal operation and are often applied reversely to the circuit components.

Another apprehension is the occurrence of abnormal operation of the PDP due to the variability in manufacturing of individual panels or the presence of extraneous substances inside cells.

SUMMARY OF THE INVENTION

An object of the present invention is to provide a circuit device and a drive circuit which overcome the prior art deficiencies, and a display apparatus which includes these components.

Another object of the present invention is to provide a circuit device and a drive circuit which do not break in the occurrence of an abnormal voltage or current, and a display apparatus which includes these components.

Still another object of the present invention is to provide a technique of protecting drive circuits used in apparatus, such as plasma display apparatus, loaded by discharge cells.

The inventive circuit device comprises conduction means which becomes conductive before an abnormal voltage that is produced on the output terminal by a load exceeds the withstand voltage of the driver section.

In a preferred form of the present invention, the driver section includes a unidirectional conduction section which yields a small voltage drop in its direction of conduction and is connected to the drive output element section, for operating to prevent an abnormal voltage, which is produced by a load, from exceeding the withstand voltage of the drive output element section. Specifically, the unidirectional conduction section is designed to yield a voltage drop in its direction of conduction smaller than the withstand voltage of the drive output element section.

In a preferred form of the present invention, the unidirectional conduction section is designed to have a response of conduction faster than that of the parasitic diode of the drive output element section.

The unidirectional conduction section is designed to have an element area smaller than that of the drive output element section.

In a preferred form of the present invention, switch elements having a fast conduction response and a small conduction resistance (small voltage drop in the conductive state) are connected between the output terminal of the drive circuit and the power source of the drive circuit and between the output terminal and the ground of the drive circuit (the switch elements may be incorporated in the drive circuit) thereby to clamp the output terminal voltage to the power voltage or the ground voltage so that a reverse voltage or current, if it is applied to the output terminal of the drive circuit, is not applied directly to the drive element.

The switch elements are designed to have such a switching characteristics and conduction voltage drop as to perform a sufficient bypass effect for abnormal flow-incharges, and are at the same time connected with elements that are designed to have such characteristics as to prevent the voltage and current in the conductive state from exceeding the ratings of the bypassed drive element. Switch elements of any kind, such as diodes, bipolar transistors, FETs, or IGBTs, that meet the above-mentioned switching characteristics and conduction voltage drop can be used for making the switch conductive by being triggered in response to the detection of a change of state at the occurrence of abnormality. The simplest scheme for attaining this purpose is to connect a diode having the above-mentioned characteristics in parallel to the drive output element.

Output elements of MOSFETs are automatically accompanied by the formation of parasitic diodes in parallel to the respective output elements and with the polarity relation to bypass abnormal charges. It is possible to improve the characteristics of the parasitic diodes based on the implantation of impurity or the like so that the parasitic diodes fully attain the purpose by themselves, and in this case, no other diodes need to be connected in parallel to the output elements.

However, elements having a fast switching speed are generally small in size, whereas parasitic diodes which accompany large output MOSFETs having a certain drive ability are also large proportionally.

Parasitic diodes have an inferior switching characteristics, and it is improved by connecting diodes having a small element area in parallel to the parasitic diodes so that the added diodes absorb to suppress a spike voltage which arises in the early period of the incoming of an abnormal current into the drive circuit, while the major abnormal current is bypassed by the parasitic diodes. In consequence, an inexpensive integrated drive circuit having a smaller chip area can be fabricated.

Although a single diode needs to be connected in parallel to each parasitic diode, the diode may be divided into multiple diodes which share the current capacity for the sake of the efficient use of the chip area and the like. The resulting much smaller diodes further improve the switching characteristics.

In a modified form of the present invention, a resistor is connected to the output terminal of the drive circuit.

These and other objects, features and advantages of the present invention will become more apparent from the following description of the preferred embodiments taken in conjunction with the accompanying drawings.

DESCRIPTION OF THE PREFERRED EMBODIMENTS

Figure 1:
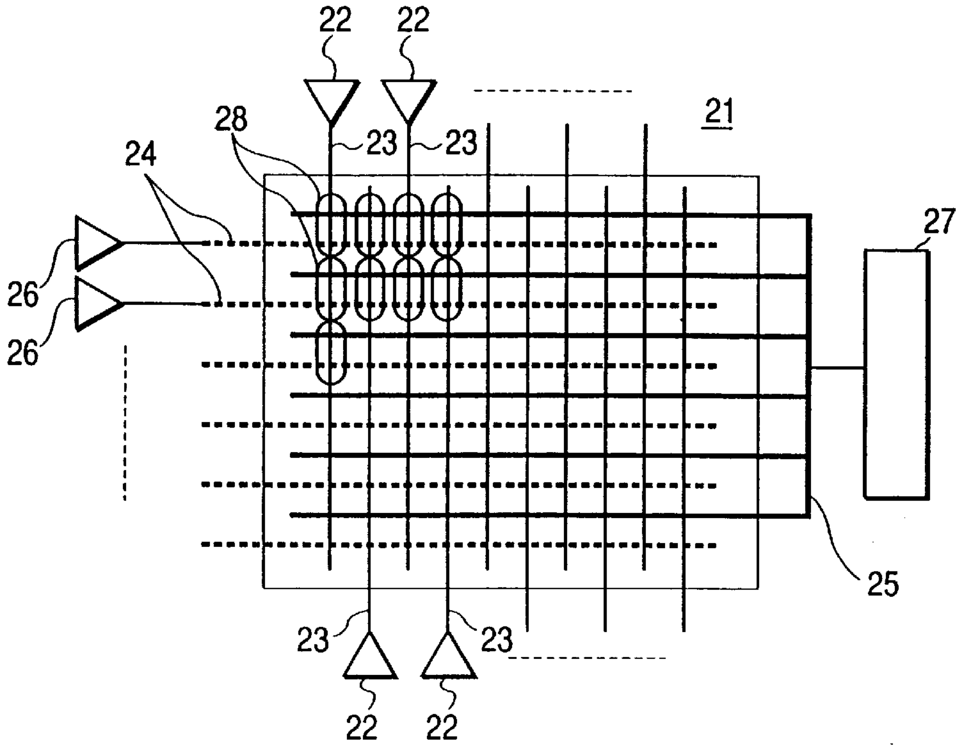
FIG. 1 PRIOR ART
FIG. 1 is a schematic diagram of the conventional drive circuit of plasma display panel.
Figure 2:
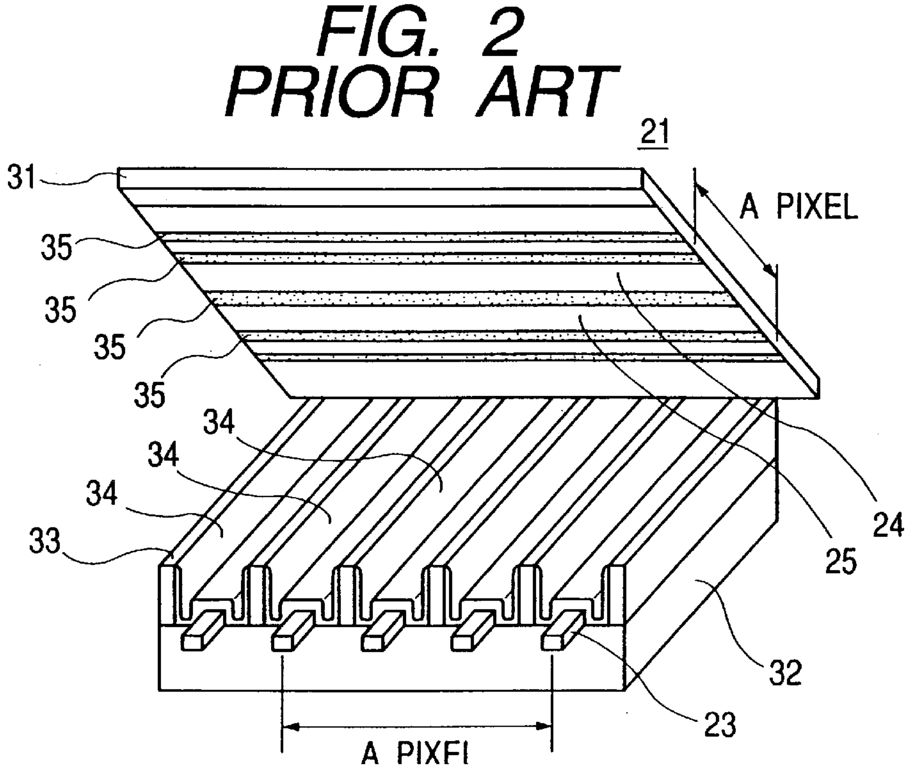
FIG. 2 PRIOR ART
FIG. 2 is a perspective view of the conventional plasma display panel.
Figure 3:
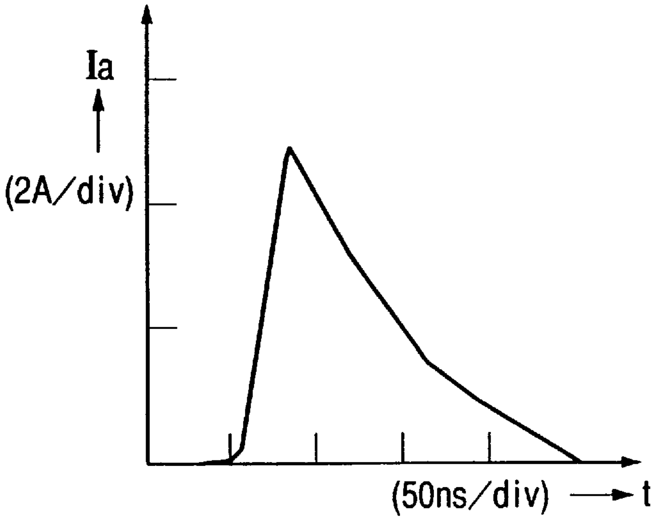
FIG. 3 is a waveform diagram showing an example of the surge current which is created by abnormal discharging in the display panel and flows into the drive circuit.
Figure 4:
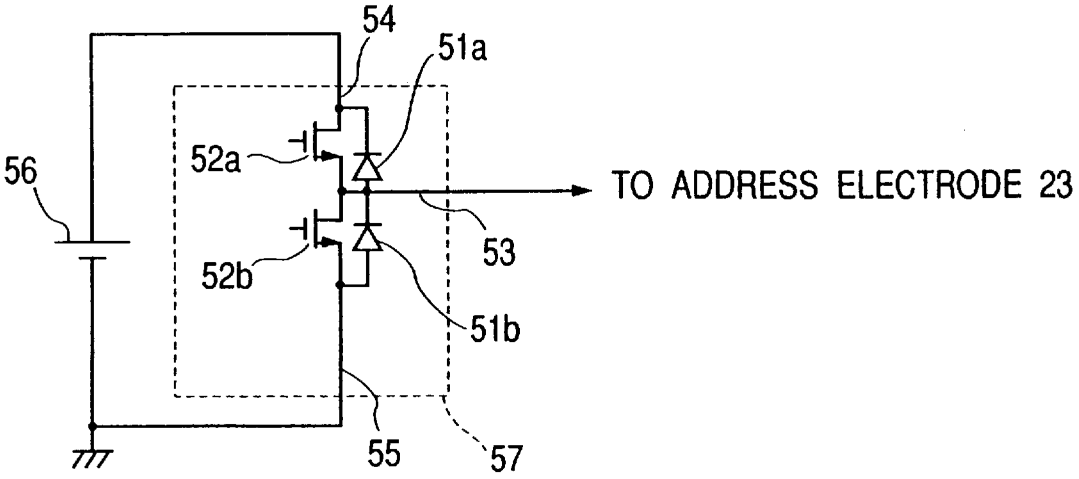
FIG. 4 PRIOR ART
FIG. 4 is a schematic diagram of the conventional drive circuit of plasma display panel.
Figure 5A:
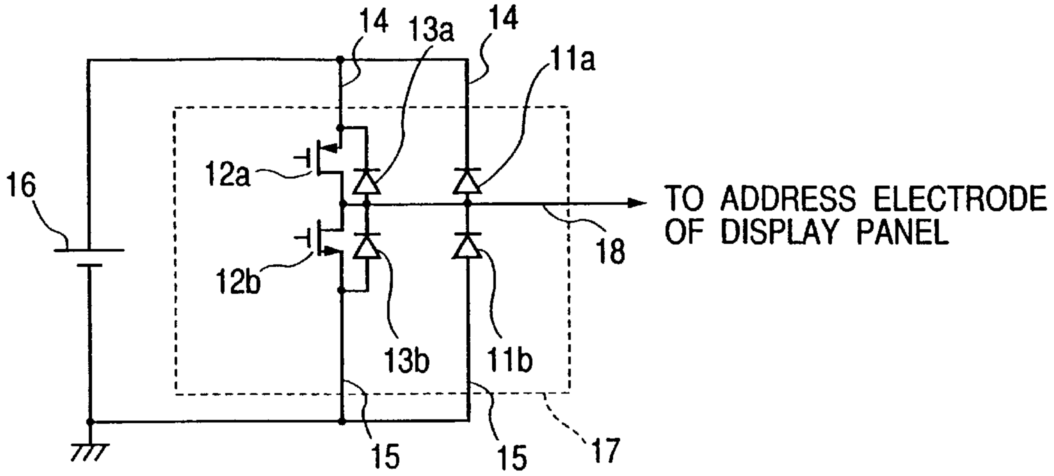
FIG. 5A is a schematic diagram of the drive circuit based on an embodiment of this invention.

FIG. 5A shows an embodiment of the drive circuit of this invention. This drive circuit employs diodes for the switch elements.

The integrated drive circuit 17 includes protection diodes, i.e., pull-up diode 11*a* and pull-down diode 11*b*, and output elements, i.e., pull-up output element 12*a* and pull-down output element 12*b*, that are MOSFETs as selected usually among possible switch elements including bipolar transistors, FETs, IGBT (insulated gate bipolar transistors), and thyristors. The output MOSFETs are p-channel CMOS FETs in this embodiment, although those of the n-channel type can be used alternatively.

The circuit 17 further includes diodes, i.e., pull-up diode 13*a* and 13*b*, that are parasitic to the output MOSFETs 12*a* and 12*b*, respectively, power supply terminals 14, and an output terminal 18 of the drive circuit. Indicated by 16 is a power source of the drive circuit.

Figure 5B:
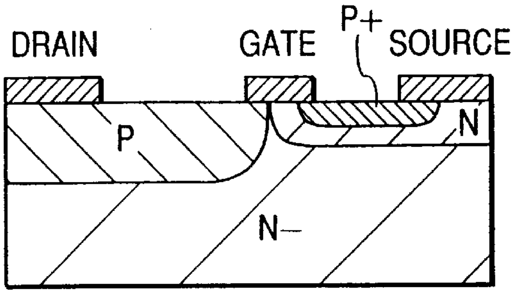
FIGS. 5B and 5C are cross-sectional views of the semiconductor element structure of the circuit.
Figure 5C:
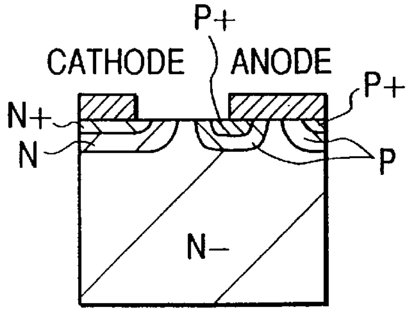

FIGS. 5B and 5C show an example of the cross-sectional structure of the pull-up output transistor and its parasitic diode, respectively, used in the embodiment shown in FIG. 5A.

Figure 6:
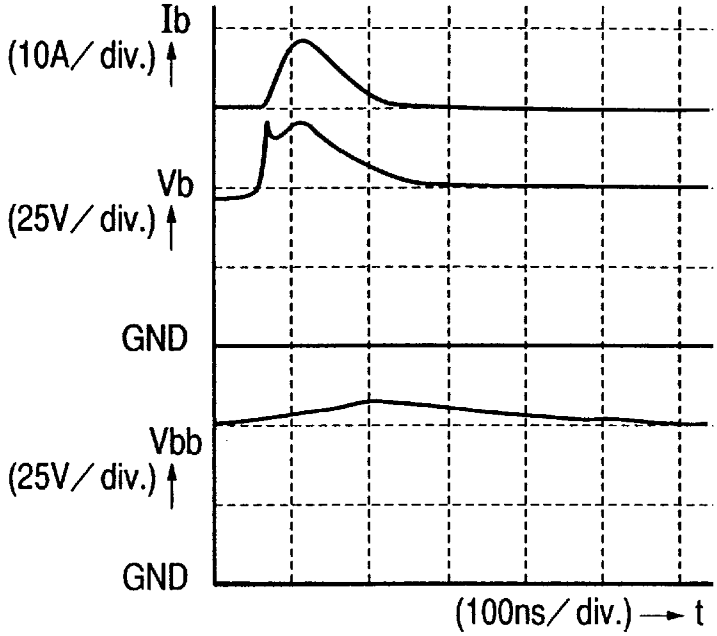
FIG. 6 is a waveform diagram showing the output terminal current and voltage and the power supply terminal voltage of the drive circuit based on this invention.

Before entering into the explanation of the inventive drive circuit shown in FIGS. 5A–5C, the phenomenon emerging at the incoming of an abnormal discharge current into the drive circuits will be described with reference to FIG. 6 and FIG. 7. FIG. 6 shows the waveforms of the drive circuit terminal current and voltage and the power supply terminal voltage observed when an artificial discharge current is fed to the output terminal of the drive circuit. The surge current Ib and voltage Vb on the output terminal and the power supply terminal voltage Vbb are plotted in 10 A/div,25 V/div and 25 V/div, respectively, on the vertical axis against the time t in 100 ns/div on the horizontal axis.

FIG. 6 reveals that when a current Ib having a large peak value and short rising time is fed to the output terminal 18, the output terminal voltage Vb, which should inherently be clamped to the power voltage by the pull-up parasitic diode 13*a*, rises significantly. This high voltage in excess of the withstand voltage of the pull-down output transistor 12*b* is applied to the drain of the transistor, causing it to break, as mentioned previously.

Figure 7:
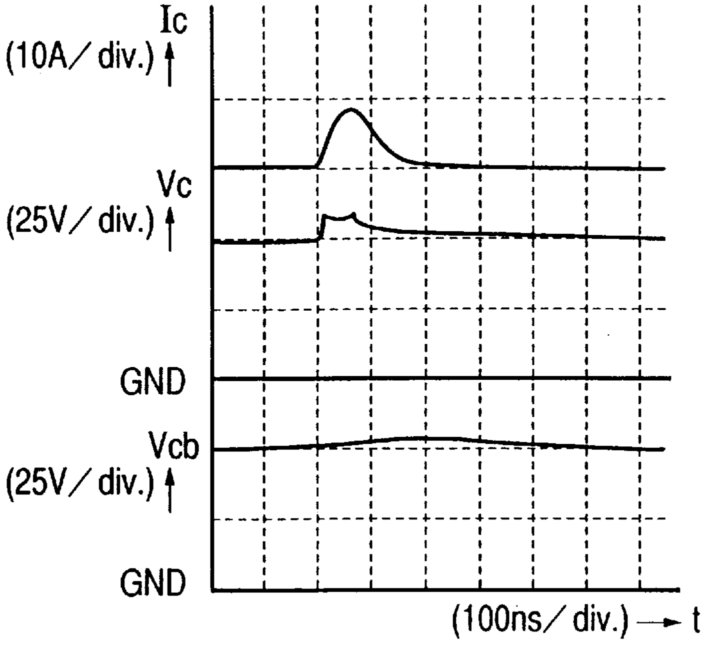
FIG. 7 is a waveform diagram showing the output terminal current and voltage and the power supply terminal voltage of the inventive drive circuit of plasma display panel.

In contrast, FIG. 7 shows the waveforms of the output terminal current and voltage and the power supply terminal voltage observed under the same condition as the case of FIG. 6, but resulting from the inventive drive circuit of plasma display panel shown in FIG. 5. The surge current Ic and voltage Vc on the output terminal and the power supply terminal voltage Vcb are plotted in 10 A/div,25 V/div and 25 V/div, respectively, on the vertical axis against the time t in 100 ns/div on the horizontal axis. The drive circuit employs protection diodes 11*a* and 11*b* of the epitaxial-planar type (with the average rectified current rating of 250 mA and withstand voltage of 250 V). The figure reveals a significant fall of the output terminal voltage Vc as compared with the case of FIG. 6.

Figure 8:
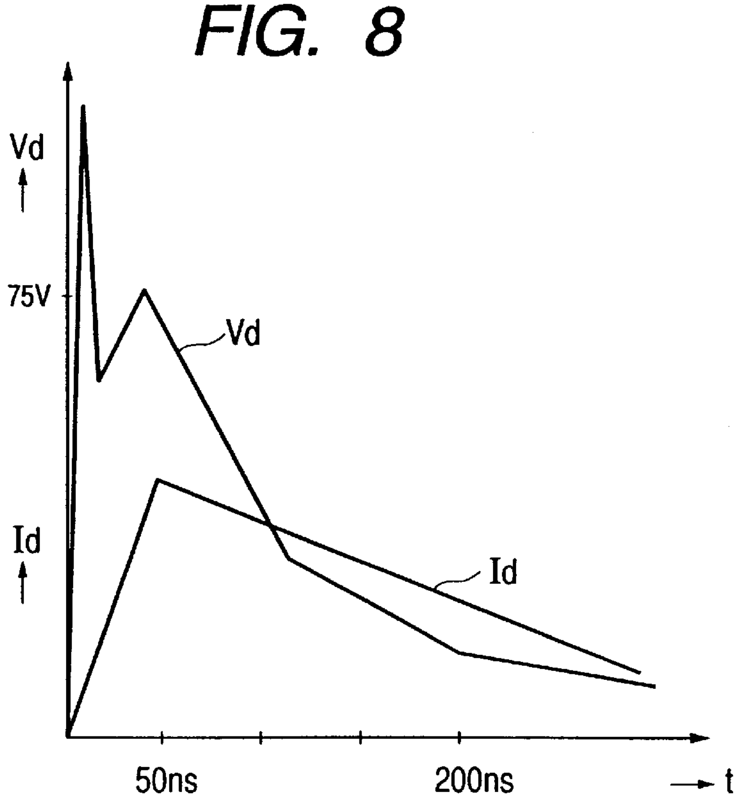
FIG. 8 is a simulated waveform diagram showing the diode voltage and current when a pulse current which rises faster than current rising time of the diode flows into the drive circuit.

FIG. 8 shows simulated waveforms of the voltage and current at the output stage of the drive circuit observed when a fast-rising pulse current that simulates an incoming abnormal discharge current is fed to the diode in the drive circuit. The voltage Vd and current Id are plotted on the vertical axis against the time t on the horizontal axis.

This waveform diagram reveals that a high voltage arises in the early short period of the surge current when the protection diodes 11*a* and 11*b* are absent in the drive circuit. The cause of high voltage creation is that the carrier of charges inside the parasitic diode 13*a* cannot respond to the fast variation of the forward current, causing the pn junction to exhibit a very high resistance. This voltage is incomparably higher than the forward voltage drop, i.e., from 0.6 to 1 V, inherent in diodes. This phenomenon was confirmed consistently based on both the simulation and the experiment mentioned previously.

A pronounced exhibition of FIG. 8 is the rising of a high voltage in the early short period of the surge current. This simulation result is for the circuit arrangement without the protection diode 11*a*. It suggests that the output transistor 12*b* will scarcely break and the drive circuit will have the enhanced reliability if the spike voltage at the rise of surge current can be prevented.

The second voltage peak is obviously different in nature from the preceding high spike voltage, and it is attributable to the voltage drop produced by the surge current flowing in the parasitic diode 13*a*. It should be noted that the waveforms of the voltage Vd and current Id shown in FIG. 8 scattered in terms of the magnitude and time during the experiment. Specifically, the current Id had a peak value ranging 4–7 A and the voltage Vd had the second peak at random on the time axis and had a wide range of peak value which was as high as 100 V or even immeasurably higher occasionally.

It will be appreciated from the foregoing that the property of the pull-up protection diode lha is the crucial factor to be considered thoroughly in finding the solution of the problem, as will be explained specifically in the following.

The characteristics required of the protection diode 11*a* are a short response time in the forward direction of diode (which is called "forward recovery time") and a small forward voltage drop even in the large current region. Namely, the protection diode la is not simply advantageous by solely having a large chip area, as suggested by FIG. 7 and FIG. 9.

Figure 9:
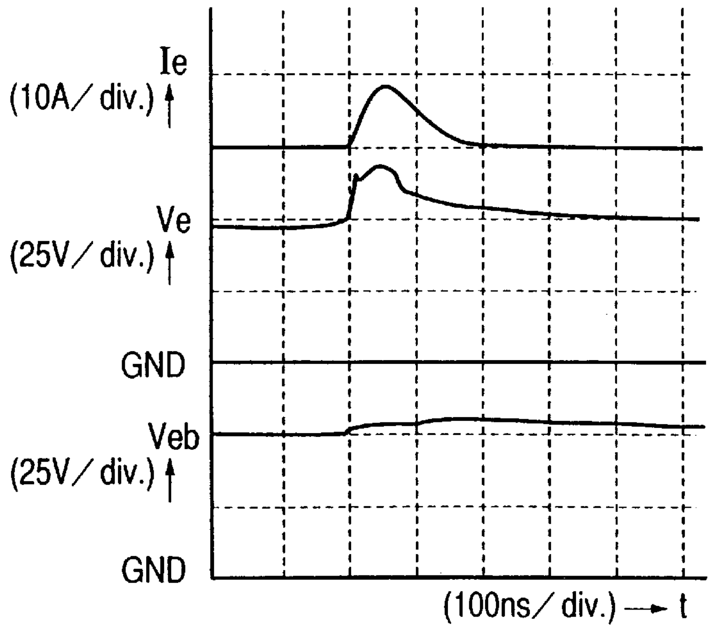
FIG. 9 is a waveform diagram showing the output terminal current and voltage and the power supply terminal voltage of the drive circuit when improper diodes are used in the drive circuit.

FIG. 9 shows the characteristics of the drive circuit of plasma display panel of the case of using improper diodes. On the graph, the surge current Ie and voltage Ve on the output terminal and the power supply terminal voltage Veb are plotted in 10 A/div,25 V/div and 25 V/div, respectively, on the vertical axis against the time t in 100 ns/div on the horizontal axis.

FIG. 7 shows the characteristics of the drive circuit of the case of using high-speed diodes, which have been developed for the surge current absorbtion, for the protection diodes 11*a* and 11*b* of FIG. 5. In contrast, FIG. 9 shows the characteristics of the drive circuit of the case of using diodes (with the average rectified current rating of 1.1 A and withstand voltage of 200 V) that are far greater in current capacity than the diodes of the case of FIG. 7. These diodes of the diffused junction type are intended for the rectifier of the commercial a.c. power supply, and are not designed in pursuit of a short forward response time.

Comparing the rising of the output terminal voltages between FIG. 7 and FIG. 9 reveals at a glance that the output terminal voltage Vc of FIG. 7 rises far lower than Ve of FIG. 9. The basis of this difference is obviously derived from the response as a diode at the beginning of forward current conduction.

The type of diode suitable for surge voltage suppress ion is the epitaxial type which features fast switching or the Schottky barrier type which has a low forward threshold voltage.

While the response of forward current conduction has been stressed, another crucial switching characteristic is the backward recovery time. Diodes with inferior backward response break themselves occasionally.

In general, semiconductor elements with good switching characteristics usually have smaller element areas, and they are fabricated easier. Semiconductor elements having large current capacities based on large element areas are generally accomplished by assembling small elements having good characteristics.

The following describes specifically the protection diodes 11*a* and 11*b*, particularly the pull-up protection diode 11*a*. These protection diodes 11*a* and 11*b*, particularly the diode 11*a*, are required to have a switching characteristics enough to respond to the rising of the surge current. Although it is ideal to accomplish these diodes with a larger element area for the sake of a larger current capacity and a smaller voltage drop at a large forward current, this scheme is not practical from the viewpoints of the fabrication process and increased cost of circuit due to the increased chip area.

Therefore, the protection diodes 11*a* and 11*b* are designed to have as small element area as possible, while having the ability enough to absorb the spike voltage at the rising portion of the surge current. This comprehensive scheme enables relatively easily the enhancement of the switching characteristics at a minimal cost of the added protection diodes 11*a* and 11*b*.

The resulting circuit arrangement, which employs the protection diode 11*a* with a very small element area and the parasitic diode 13*a* which is not so good in characteristics but inherently has a large element area capable of dealing with a large abnormal discharge current, performs very efficiently. Namely, this scheme is based on the increased element area of the output transistor which is intended to increase the steady-state driving capacity of the circuit.

The simulation result of FIG. 8 reveals another advantage of this circuit arrangement, in which the voltage drop caused by the diode current Id has a peak after the rising of the current, allowing of a marginal time of switching for the output transistor.

Accordingly, the parasitic diodes 13*a* and 13*b* of the output transistors 12*a* and 12*b* and the protection diodes 11*a* and 11*b* connected in parallel to these diodes can be designed uniquely to meet their clearly separated roles, whereby the drive circuit can be arranged properly in terms of both the performance and cost.

Besides the semiconductor structure of the protection diodes 11*a* and 11*b* shown in FIG. 5 as an example, any other structure that meets the performance and processing condition can be added to the drive circuit.

Next, the withstand voltage of the driving transistors will be explained. As described above, it is possible to suppress the voltage rise on the output terminal 18 irrespective of the characteristics of the parasitic diodes 13*a* and 13*b* by adding the protection diodes 11*a* and 11*b* having the proper characteristics. In addition, the drive circuit will become more reliable obviously if the output transistors 12*a* and 12*b* have an increased withstand voltage, as will be explained in the following.

Generally, semiconductor elements including MOSFETs have the highest withstand voltage in their cutoff state, and the maximum ratings of IC devices are determined from this withstand voltage. However, the output transistor can possibly have the application of a high voltage in its active state between the drain and source if an abnormal discharge current or the like flows into the drive circuit as mentioned previously.

The transistor has a lower drain-source withstand voltage in its active state, and the withstand voltage becomes further lower as the gate-source voltage goes higher (the drain current will increase) and it can break at a lower voltage. It is necessary for the circuit component (e.g., the pull-down output transistor 12*b* in FIG. 5) to sustain the rising drain voltage caused by the flow-in charges resulting from abnormal discharging. One scheme is to form the protection diodes 11*a* and 11*b* shown in FIG. 5 and, at the same time, provide the pull-down output transistor 12*b* with the drain-source withstand voltage that is the power voltage added by the forward voltage drop of the pull-up protection diode 11*a* and, when necessary, further added by the voltage drop of the wiring and the like in the circuit.

The drive circuit of plasma display panel having a load of discharge cell is distinct in that the withstand voltage of the transistors is crucial in their conductive state rather than the cutoff state. In the actual drive circuit, the voltage rise on the power supply terminal 14 is small because of the low impedance design of the power source (in the frequency range from d.c. to a high frequency region used). However, if the voltage on the power supply terminal 14 of the drive circuit rises, this voltage rise must be taken into account for the withstand voltage of the transistors.

The output transistors 12*a* and 12*b* are not only varied in their drain current by the gate-source voltage, but also varied in their withstand voltage depending on the operational state, as mentioned previously. The drive circuit output stage must be designed to stabilize the gate-source voltage of the transistors so as to avoid the deterioration of withstand voltage by the noise and other causes. Accordingly, as vital matters in designing the drive circuit, the protection diodes 11*a* and 11*b* yield a small forward voltage drop even in the transitional state, and the output transistors 12*a* and 12*b* have a withstand voltage higher than the power voltage throughout the operation and have their gate-source voltage stabilized so that the deterioration of withstand voltage during the operation is minimized.

The foregoing case is the flow-in of charges caused by abnormal discharging into the drive circuit, and the following describes the case of an abnormal current flowing out of the drive circuit. The current of this case flows from the ground to the display panel through the output terminal in FIG. 5A.

In this case, the output terminal 18 becomes below the ground voltage, causing the output transistor 12*a* to have its source connected to the ground terminal 15 and work as pull-down transistor and the output transistor 12*b* to have its source connected to the power supply terminal 14 and work as pull-up transistor in FIG. 5.

On this account, the elements on the pull-up side (output transistor 12*a*, diode lha and parasitic diode 13*a*) and the pre-stage transistor (not shown) which drives the output transistor 12*a* are required to have a withstand voltage that is at least the power voltage plus the forward voltage drop of the pull-down protection diode lib by the reason explained previously.

Figure 10:
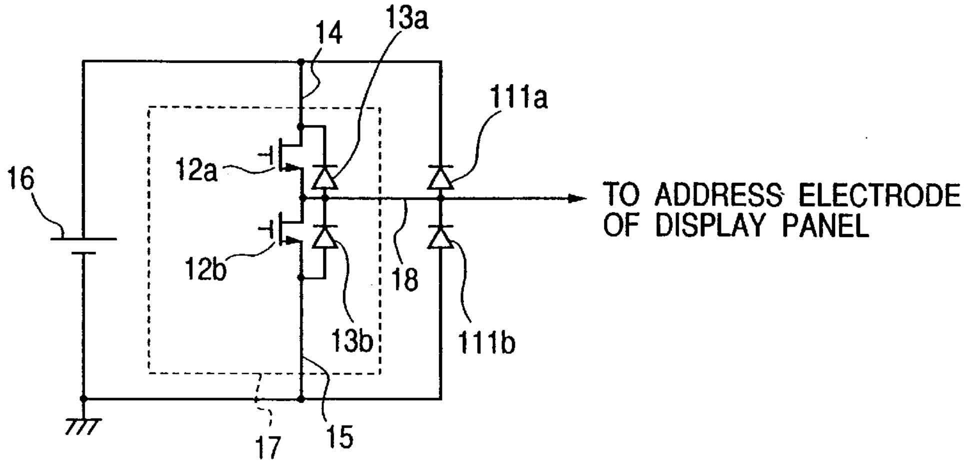
FIG. 10 is a schematic diagram of the drive circuit based on another embodiment of this invention.

Although the protection diodes 11*a* and 11*b* are incorporated within the integrated drive circuit (IC device) in the foregoing embodiment, these diodes may be connected as diodes 111*a* and 111*b* outside of the integrated drive circuit as shown in FIG. 10 as another embodiment of this invention. Specifically, the pull-up protection diode 111*a* and pull-down protection 111*b* are connected between the power supply terminal 14 and output terminal 18 and between the ground terminal 15 and output terminal 18, respectively.

Although the pull-up transistor in FIG. 5 is formed of a p-channel MOSFET, it may be an n-channel MOSFET, thereby arranging the output stage in a totem-pole circuit configuration, and the drive circuit operates identically. Each of the diodes 11*a* and 11*b* in FIG. 5 and diodes 111*a* and 111*b* in FIG. 10 may be formed of multiple diodes connected in parallel.

Figure 12:
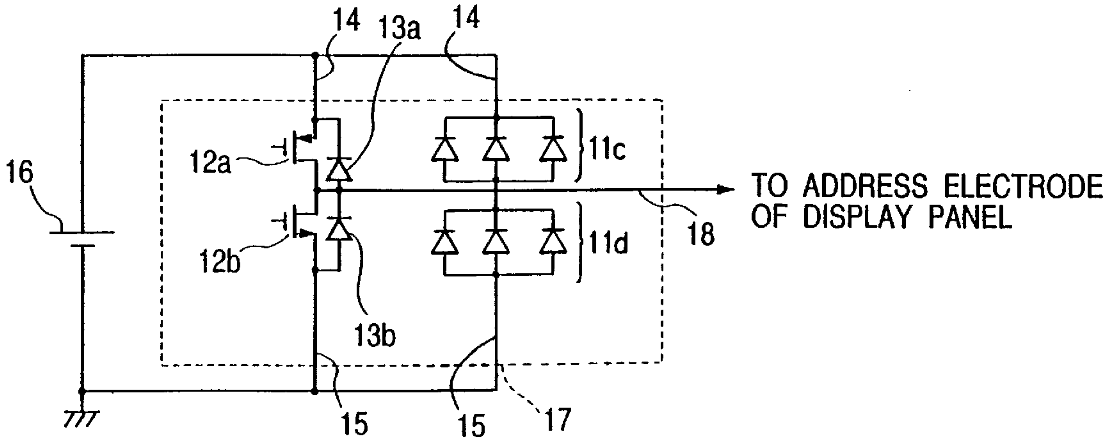
FIG. 12 is a schematic circuit of a modification of the drive circuit shown in FIG. 5A.

For example, FIG. 12 shows a modification of the drive circuit shown in FIG. 5A with diode 11*a* in FIG. 5A being formed of three diodes 11*c* connected in parallel, and diode 11*b* in FIG. 5A being formed of three diodes 11*d* connected in parallel.

Figure 13:
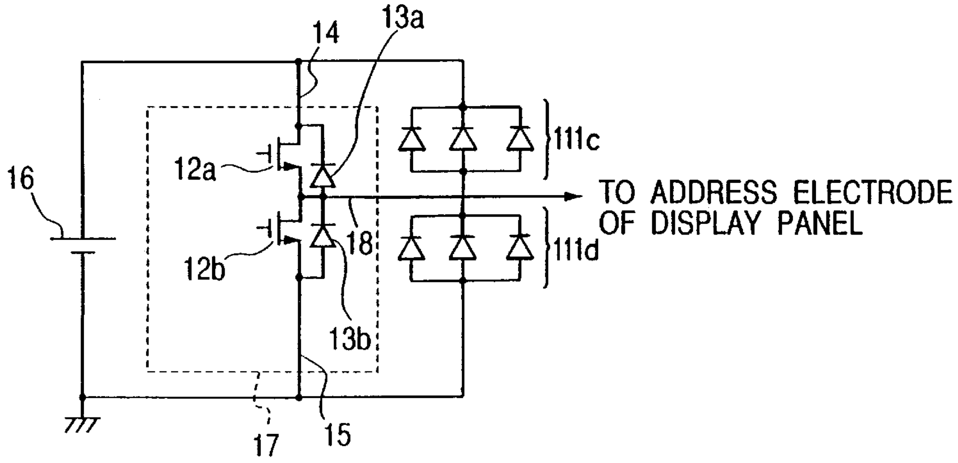
FIG. 13 is a schematic circuit of a modification of the drive circuit shown in FIG. 10.

Also, FIG. 13 shows a modification of the drive circuit shown in FIG. 10 with diode 111*a* in FIG. 10 being formed of three diodes 111*c* connected in parallel, and diode 111*b* in FIG. 10 being formed of three diodes and connected in parallel.

Figure 11:
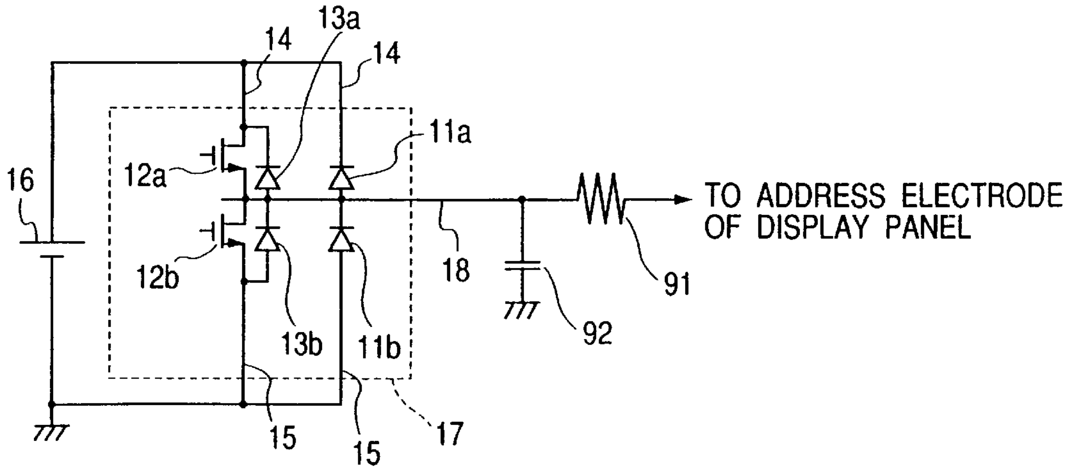
FIG. 11 is a schematic diagram of the drive circuit based on still another embodiment of this invention.

FIG. 11 shows the drive circuit based on still another embodiment of this invention, which is intended to improve the reliability of the circuit by connecting a resistor, which is durable against a surge current, on the line between the discharge cell and the output terminal (at a position nearer to the discharge cell than the node of the protection diodes). Indicated by 91 is the added protection resistor, and 92 is the equivalent capacitance (the capacitance is actually distributed) of the line and the drive circuit seen from the output terminal.

The resistor 91 is selected in the range of 50–2000 Ω in consideration of the time constant, which is the product of this resistance and the capacitance of the output signal line, is permissible to act on the address drive signal waveform. The resistor 91 which needs to withstand a large surge current caused by abnormal discharging is preferably of the thick-film type or bulk type (solid type), instead of the thin-film type. The resistor 91 has roles of dissipating energy and also dulling the waveform of the abnormal discharge current before it flows into the drive circuit. Dulling the waveform of the abnormal discharge current suppresses the creation of surge voltage, and consequently the elements of the drive circuit can have a marginal withstand voltage and can have their chance of breakdown reduced significantly.

As described above, the present invention offers at a low cost a drive circuit, particularly a drive circuit of plasma display panel, which is protected from an abnormal voltage and current that are caused by the cross-talk attributable to the capacitive component of the load or caused by abnormal discharging. By the application of this invention, it becomes possible to improve the reliability of plasma display systems of 40 inches and larger in its picture size having large load capacitances, high-definition plasma display systems of types SVGA (800-by-600 dots), XGA (1024-by-768 dots) and SXGA (1280-by-1024 dots) which have high drive pulse rates and large inter-electrode capacitances due to the finely divided electrodes.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A circuit device comprising: a driver section; an output terminal which is provided on said driver section for being connected to a load; and conduction means which becomes conductive before an abnormal voltage that is produced on said output terminal by said load exceeds the withstand voltage of said driver section.

2. A drive circuit comprising: a drive output element section; a unidirectional conduction section which yields a small voltage drop in the forward direction thereof and is connected to said drive output element section; and an output terminal which is produced on said drive output element section for being connected to a load, said unidirectional conduction section operating such that an abnormal voltage which is produced on said output terminal by said load does not exceed the withstand voltage of said drive output element section.

3. A display apparatus comprising: a driver section; an output terminal provided on said driver section; a matrix panel which has an electrode and is connected to said output terminal; and a conduction section which becomes conductive before a voltage caused by abnormal discharging on said electrode of said matrix panel exceeds the withstand voltage of said driver section.

4. A display apparatus according to claim 3, wherein said conduction section comprises a unidirectional conduction section which yields a small voltage drop in the conduction direction thereof, said unidirectional conduction section operating such that an abnormal voltage caused by said matrix panel is lowered below the withstand voltage of said driver section.

5. A drive circuit comprising:

a MOSFET having an output terminal for being connected to a load;

a parasitic diode of said MOSFET; and a unidirectional conduction section including said parasitic diode, said unidirectional conduction section becoming conductive before a voltage which is produced by abnormal discharging of said load exceeds the withstand voltage of said MOSFET.

6. A display apparatus comprising:

a matrix panel having an electrode; and a drive circuit including, as a drive output element, a MOSFET which is connected to said electrode, a parasitic diode of said MOSFET, and a unidirectional conduction section which includes said parasitic diode and yields a small voltage drop in the forward direction thereof, said drive circuit operating such that a voltage produced by abnormal discharging on said electrode of said matrix panel is lowered below the withstand voltage of said MOSFET.

7. A drive circuit comprising:

a drive element having an output terminal to be connected to a load;

a circuit section having a conduction section which becomes conductive before a voltage produced by said load exceeds the withstand voltage of said drive element; and a resistor connected to said circuit section.

8. A display apparatus comprising:

a matrix panel having an electrode; and a circuit section including a driver section which is connected to said electrode of said matrix panel, and a conduction section which becomes conductive before a voltage produced on said electrode of said matrix panel exceeds the withstand voltage of said driver section; and a resistor connected between said conduction section and said matrix panel so that the voltage produced on said electrode of said matrix panel is applied to said driver section through said resistor.

9. A circuit device comprising: a drive element having a parasitic diode; and unidirectional switch means which is faster in response of conduction than said parasitic diode.

10. A circuit device according to claim 9, wherein said unidirectional switch means has an element area smaller than that of said drive element.

11. A circuit device according to claim 9, wherein said unidirectional switch means comprises a diode.

12. A circuit device according to claim 9, wherein said unidirectional switch means comprises a plurality of switch elements connected in parallel.

13. A drive circuit comprising:

a drive element which has a terminal to be connected to a load and has a parasitic diode which conducts one of power from a power source to a load and charge from said load to a ground; and a diode which is faster in response of conduction than said parasitic diode and is connected in parallel to said drive element.

14. Adrive circuit according to claim 13, wherein said diode has an element area smaller than that of said drive element.

15. A display apparatus comprising a circuit device which includes a drive element having a parasitic diode, and unidirectional switch means which has an element area smaller than that of said drive element, is faster in response of conduction than said parasitic diode, and is connected in parallel to said drive element.

16. A display apparatus according to claim 15, wherein said circuit device has a load that is a plasma display panel having an address electrode.

17. A display apparatus comprising:

a display section having an address electrode formed of a discharge cell; and a drive circuit including a drive element which has a parasitic diode and is connected to said address electrode, and unidirectional switch means which has an element area smaller than that of said drive element, is faster in response of conduction than said parasitic diode, and is connected in parallel to said drive element, said drive circuit driving said display section.

18. A display apparatus according to claim 17, wherein said unidirectional switch means comprises a plurality of switch elements connected in parallel.

19. A display apparatus comprising:

a plasma display panel having an address electrode; and an address drive circuit which includes a pull-up transistor having a parasitic diode, a pull-down transistor having a parasitic diode and is connected in series to said pull-up transistor, means of connecting the node of said pull-up transistor and said pull-down transistor to said address electrode, and unidirectional switch means which has an element area smaller than that of said parasitic diode and is connected in parallel to said pull-up transistor, said unidirectional switch means becoming conductive faster than said parasitic diode in response to an abnormal discharge voltage arising on said address electrode.

20. A display apparatus according to claim 19, wherein said address drive circuit further includes a resistor which is connected between the node of said pull-up and pull-down transistors and said address electrode.

21. A display apparatus according to claim 19, wherein said address drive circuit further includes another unidirectional switch means which becomes conductive faster than said parasitic diode of said pull-down transistor and is connected in parallel to said pull-down transistor.

22. A display apparatus according to claim 19, wherein said pull-up transistor and said pull-down transistor are connected in series between a power source and the ground.

* * * * *